United States Patent [19]
Yamashita

[11] Patent Number: 5,918,146
[45] Date of Patent: Jun. 29, 1999

[54] METHOD OF MANUFACTURING SEMICONDUCTOR DEVICE HAVING MULTILAYER WIRING STRUCTURE, WITH IMPROVED VERSION OF STEP OF FORMING INTERLAYER DIELECTRIC LAYER

[75] Inventor: Atsuko Yamashita, Yokosuka, Japan

[73] Assignee: Kabushiki Kaisha Toshiba, Kawasaki, Japan

[21] Appl. No.: 08/593,388

[22] Filed: Jan. 29, 1996

[30] Foreign Application Priority Data

Jan. 30, 1995 [JP] Japan ................................. 7-012411

[51] Int. Cl.$^6$ .............................................. H01L 21/3205
[52] U.S. Cl. ............................................ 438/631; 438/622
[58] Field of Search ................................... 438/622, 623, 438/631

[56] References Cited

U.S. PATENT DOCUMENTS

| | | | |
|---|---|---|---|
| 4,781,942 | 11/1988 | Leyden et al. | 427/54.1 |
| 4,992,306 | 2/1991 | Hochberg et al. | 427/255.3 |

FOREIGN PATENT DOCUMENTS

| | | |
|---|---|---|
| 0 497 306 | 8/1992 | European Pat. Off. . |
| 0 519 079 | 12/1992 | European Pat. Off. . |

OTHER PUBLICATIONS

S.K. Ghandi, VLSI Fabrication Principles: Silicon and Gallium Arsenide (2nd edition), John Wiley, pp. 724–725 (no month given), 1994.

Dobson et al., "Advanced SiO$_2$ Planarization Using Silane and H$_2$O$_2$", Semiconductor International, pp. 85–88, 1995.

Matsuura et al., "Novel Self–planarizing CVD Oxide for Interlayer Dielectric Applications", IEEE, pp. 117–120, 1994.

Nikkei Microdevices, pp. 105–112, 1995.

Matsuura et al., "Novel Self–planarizing CVD Oxide for Interlayer Dielectric Applications," International Electron Devices Meeting 1994, San Francisco, CA, Dec. 11–14, 1994, pp. 117–120.

*Primary Examiner*—Charles Bowers
*Assistant Examiner*—Keith Christianson
*Attorney, Agent, or Firm*—Finnegan, Henderson, Farabow, Garrett & Dunner, L.L.P.

[57] ABSTRACT

In the method of the present invention, for manufacturing a semiconductor device having a multilayered wiring structure, with an improved version of step of forming an interlayer insulation film, an aromatic or heterocyclic compound containing an Si—H group, and H$_2$O$_2$ are introduced in a reaction chamber in which a semiconductor device is contained, and they are made to react with each other in a vacuum atmosphere of 665 Pa or lower at a temperature in a range of −10° C. to +10° C. Thus, an intermediate reaction product having an excellent planarization property in which a reflow thereof is promoted due to the Si—H group, is formed on the semiconductor substrate. The intermediate reaction product is then subjected to a heat treatment so as to induce a dehydration reaction, thereby obtaining a silicon-based oxide film having a reflow shape, a network structure and a low dielectric constant.

2 Claims, 2 Drawing Sheets

METHOD OF MANUFACTURING SEMICONDUCTOR DEVICE HAVING MULTILAYER WIRING STRUCTURE, WITH IMPROVED VERSION OF STEP OF FORMING INTERLAYER DIELECTRIC LAYER

BACKGROUND OF THE INVENTION

1. Field of the Invention

The present invention relates to a method of manufacturing a semiconductor device having a multilayer wiring structure, with an improved version of the step of forming an interlayer insulation layer.

2. Description of the Related Art

In accordance with an increase in the density of integration of a semiconductor device, a so-called multilayer interconnection, in which wiring materials are formed on a substrate in a multilayered manner, is developed. Consequently, the method of manufacturing a semiconductor device having such a multilayer interconnection structure, is becoming complex and the number of steps involved are being increased.

Especially, the steps of forming wiring layers greatly influences the manufacturing cost of the semiconductor device. Therefore, in order to decrease the cost required to manufacture a semiconductor device, it is very important to facilitate the manufacture steps, and decrease the number of manufacturing steps for forming wiring layers.

The following is a description of a conventional process for forming a multilayer interconnection structure.

To begin with, the first wiring material used for an underlying wiring layer is deposited on a substrate, and the underlying wiring layer is subjected to patterning. The first insulation film is formed on the patterned underlying wiring layers, as well as to fill the spaces between the adjacent underlying wiring layers.

At this point, due to the patterning of the underlying wiring layers, steps are created on the surface of the first insulation film. These steps may adversely affect the deposition of a second wiring material serving as an overlying wiring layer, and the patterning of the overlying wiring layer, which may results in serious defects such as breakage of wiring in the overlying wiring layer and occurrence of a short circuit.

As a solution to such drawbacks, conventionally, the surface of the first insulation film, which is the underlying layer of the second wiring material, is planarized by resist etchback in order to planarize the steps before the second wiring layer is deposited on the first insulation film.

The conventional process of forming an interlayer insulation layer, in which the second insulation film is laminated on the first insulation film, proceeds in the following manner. That is, after a first insulation film is formed in the first layer forming step, the first insulation film is planarized in the planarizing step, and then the second insulation film is formed in the second film forming step. The conventional interlayer insulation film forming process, which proceeds in the above-described manner, does not meet with the aforementioned demand, i.e. a decrease in the number of manufacturing steps a multilayer interconnection structure.

In the meantime, as an example of the technique of planarizing the surface of an interlayer insulation film, which can satisfy the demand of decreasing the number of manufacturing steps for making a multilayered interconnection structure, an APL (Advanced Planarization Layer) process is disclosed in documents, namely, Matsuura et al., IEEE Tech. Dig., pp 117, 1994 and Semiconductor International (December 1994).

In this APL process, during the formation of an interlayer insulation film, a $SiH_4$ gas and $H_2O_2$ (hydrogen peroxide solution) which serves as an oxidizer are made to react with each other at a low temperature (for example, about 0° C.) in a vacuum atmosphere, thus forming a reflow $SiO_2$ film on an underlying wiring layer. The reflow $SiO_2$ film is defined as a film having a reflow form of which the surface tomography is smoothed over lower wires.

The reaction which takes place in the process is expressed in a chemical formula in Formula 1 below. In this reaction, the reflow is promoted by having an Si—H group.

Formula 1

$$SiH_4 + H_2O_2 \rightarrow Si(OH)_4 \rightarrow SO_2 + 2H_2O\uparrow$$

In the above-described step, the filing the spaces between underlying wiring portions with an insulation film and the planarization of the surface of the insulation film can be carried out at the same time, and the manufacturing steps which take, up to the planarization can be completed by one film forming step. Consequently, the number of manufacturing for steps forming a multilayered interconnection structure can be decreased.

In this film formation process, before the reflow $SiO_2$ film is formed, the first interlayer insulation film (the first plasma CVD insulation film) is formed on the underlying wiring layer by an ordinary plasma CVD method. After the formation of the reflow $SiO_2$ film, the second plasma CVD insulation film serving as the second interlayer insulation film (cap layer) is formed thereon by the ordinary plasma CVD method. Then, furnace annealing is carried out.

However, the relative dielectric constant of an ordinary $SiO_2$ film formed by heat oxidation is only about 3.9, whereas that of the reflow insulation film formed by the process described in the above documents is as high as about 4.5 to 4.7. Thus, the demand of a low relative dielectric constant:, which is required by a high-speed device, cannot be easily satisfied.

Further, as another conventional example, NIKKEI MICRODEVICES, pp 105, July 1995, particularly, TABLE 1 provided on page 109, discloses a method in which an aromatic compound such as polyimide, which serves as a low dielectric material, is formed on a semiconductor substrate by spin-coat, so as to manufacture an insulation film having a relative dielectric constant lower than that of an ordinary $SiO_2$ film.

In this method, a low dielectric constant is achieved by involving a cyclic or network structure as shown in Formula 2 below; however such a method does not work for a good reflow property, in which the surface of the insulation film which covers a fine pattern as of an underlying wiring layer is planarized.

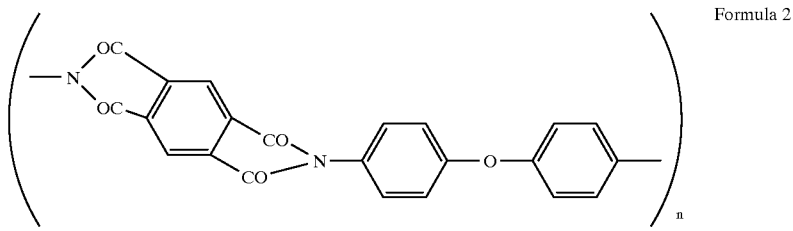

Formula 2

SUMMARY OF THE INVENTION

The present invention has been proposed to remove the above-described drawbacks and the object thereof is to provide a method of manufacturing a semiconductor device having a multilayered wiring structure, with an improved version of manufacturing step of forming an interlayer insulation film, the method being capable of achieving a low dielectric constant by involving a cyclic or network structure of the compound, and an excellent reflow property in which the surface of the insulation film which covers a fine pattern as of an underlying wiring layer is planarized, and capable of decreasing the number of manufacturing steps for forming a multilayered interconnection structure, for facilitation of the method.

In order to achieve the above object, the method of the present invention, for manufacturing a semiconductor device having a multilayered wiring structure, with an improved version of step of forming an interlayer insulation film, involves the steps of:

introducing an aromatic or heterocyclic compound containing an Si—H group, and $H_2O_2$ into a reaction chamber in which a semiconductor device is contained, and making them react with each other in a vacuum atmosphere of 665 Pa or lower at a temperature in a range of $-10°$ C. to $+10°$ C., thereby obtaining an intermediate reaction product on the semiconductor substrate, the intermediate reaction product having an excellent planarization property in which a reflow thereof is promoted due to the Si—H group; and subjecting the intermediate reaction product to a heat treatment so as to induce a dehydration reaction, thereby obtaining a silicon-based oxide film having a reflow shape, a network structure and a low dielectric constant.

The present invention further provides a method of manufacturing a semiconductor device having a multilayered wiring structure, with an improved version of step of forming an interlayer insulation film, involving the steps of:

forming an insulation film on a wiring layer formed on a semiconductor substrate;

applying an aromatic or heterocyclic compound containing an Si—H group, on the semiconductor substrate by a spin-coat technique, after the formation of the insulation film; and performing a heat treatment so that a dehydration reaction occurs to the compound applied.

Through the above-described steps, the method of the present invention, for manufacturing a semiconductor device having a multilayered wiring structure, with an improved version of step of forming an interlayer insulation film, can provide an interlayer insulation film having an excellent planarization property and a low relative dielectric constant at a low cost without adding a special planarization step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENT

An embodiment of the present invention will now be described with reference to accompanying drawings.

Figure 1:
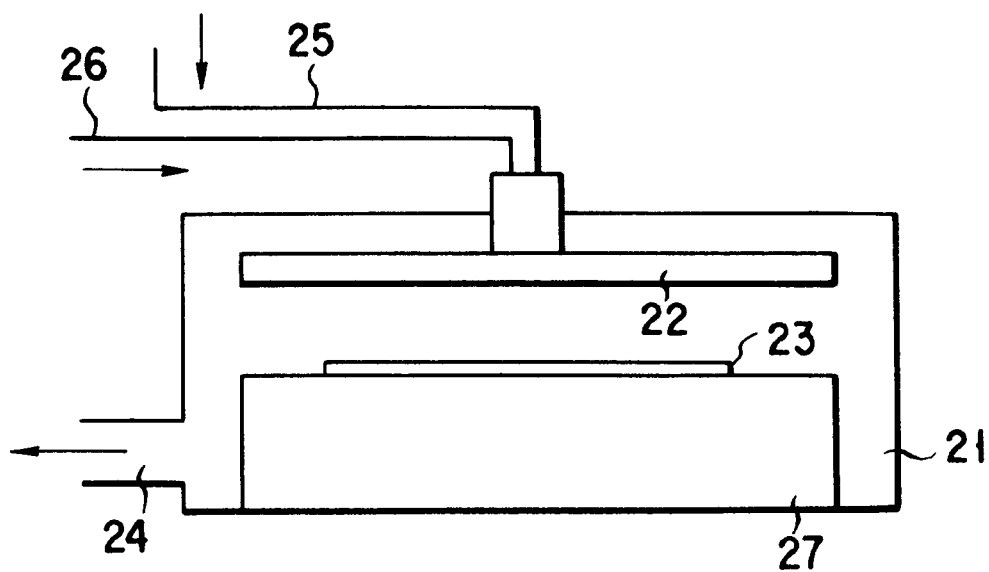
FIG. 1 is a schematic diagram showing a semiconductor manufacturing device used in the method of the present invention, for manufacturing a semiconductor device having a multilayered wiring structure, with an improved version of step of forming an interlayer insulation film.

FIG. 1 is a schematic view of an example of the structure of a reduced pressure CVD apparatus used in the method of manufacturing a semiconductor device, according to the present invention.

As can be seen in this figure, a lower electrode (table) 23 is placed on a table 27 in a reaction chamber 21, and an upper electrode (shower head) 22 is provided directly thereabove.

A supplying passage 25 for supplying an aromatic compound (or heterocyclic compound) containing an Si—H group and a supplying passage 26 for supplying $H_2O_2$, are connected to the reaction chamber 21.

An exhaust opening 24 is provided at the lower portion of the reaction chamber 21.

FIGS. 2A to 2G are cross sectional views each illustrating a respective manufacturing step in the embodiment of the method of manufacturing a semiconductor device, according to the present invention.

Figure 2A:
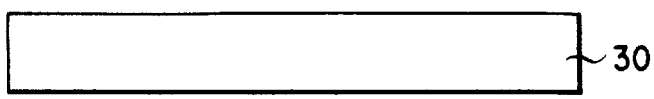
FIGS. 2A to 2G are cross sectional views illustrating manufacturing steps of an embodiment of the method of manufacturing a semiconductor device, according to the present invention.

First, on a semiconductor substrate 30 (usually, silicon wafer) as shown in FIG. 2A, a first layer wiring material 31

Figure 2B:
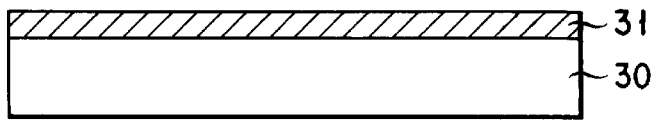

(for example, aluminum containing Si and Cu) serving as an underlying wiring layer such as shown in FIG. 2B is deposited by, for example, a sputtering method.

Figure 2C:
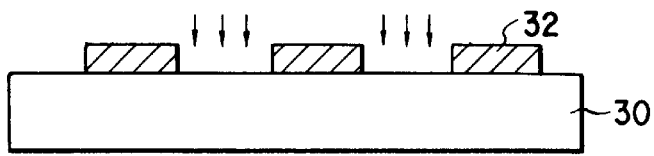
Figure 2D:
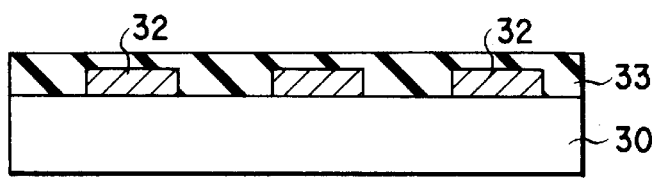

Next, as can be seen in FIG. 2C, the first wiring material is patterned by a photolithography technique and a reactive ion etching (RIE) technique, so as to form underlying wiring layers 32.

Then, spaces between the underlying wiring layers 32 are filled with an insulation film, and an insulation film is deposited on the underlying wiring layers 32, thus forming an interlayer insulation film 33.

In the step of forming the interlayer insulation film 33, after the formation of the underlying wiring layer, the semiconductor substrate 30 is placed on a board made of, for example, quartz, in the chamber 21 of the semiconductor manufacturing device shown in FIG. 1. Then, an aromatic or heterocyclic compound having a cyclic or network structure as shown in (1) of the reaction formula shown in TABLE 3 and containing an Si—H group, and $H_2O_2$ are introduced in the chamber 21, and they are made to react with each other in a vacuum atmosphere of 5 Torr=5×133.322 Pa (about 665 Pa) or lower, at a temperature within a range of −10° C. to +10° C., thereby obtaining an intermediate reaction product having a thickness of 0.8 μm, represented by (2) in the above reaction formula in TABLE 3, on the semiconductor substrate 10, the intermediate reaction product having an excellent planarization property in which a reflow thereof is promoted due to the Si—H group.

During this time, the reflow is promoted as the intermediate reaction product as shown by (2) of the reaction formula in TABLE 3 involves the Si—H group.

Next, a heat treatment is carried out so that a dehydration reaction takes place in the intermediate reaction product. Thus, a silicon-based oxide film 33 (reflow $SiO_2$ film in this embodiment) having a reflow shape and a network structure, and having a low dielectric constant, is formed. It should be noted that the above-described heat treatment can be skipped and carried out in a later heat treatment step altogether.

In the heat treatment, the temperature inside the chamber 21 is set within a range of 300° C. to 400° C., and let it leave such a state for 90 seconds or more but 600 seconds or less, for example.

Figure 2E:
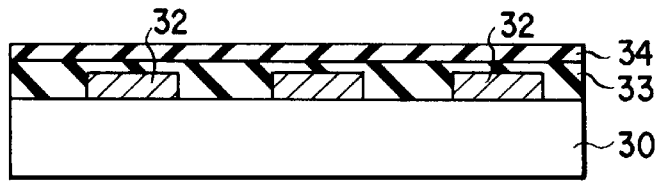

Next, the temperature of the inside of the chamber 21 is set within a range between 300° C. and 400° C., and with introduction of, for example, an $SiH_4$ gas and $N_2O$, a plasma CVD $SiO_2$ film 34 having a thickness of 0.3 μm is formed on the entire surface of the semiconductor substrate 30, as shown in FIG. 2E.

Figure 2F:
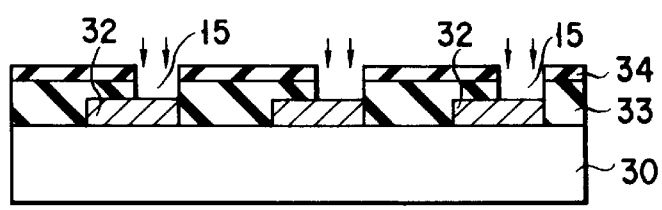
Figure 2G:
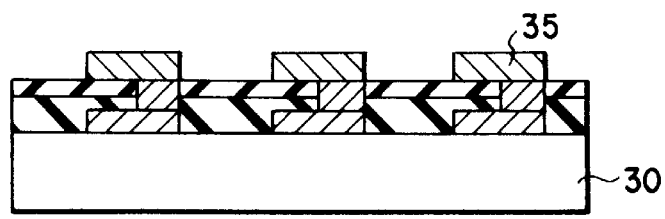

The reflow $SiO_2$ film 33 and the plasma CVD $SiO_2$ film 34 thus formed are subjected to etching so as to make contact holes 15 as shown in FIG. 2F or via holes. Further, as can be seen in FIG. 2G, a second layer wiring material serving as an overlying wiring layer is deposited, and then patterning is carried out to form an overlying wiring layer 35.

By use of the reduced pressure CVD method which is carried out at a low temperature, an intermediate reaction product represented by (2) in the reaction formula shown in Formula 3 below, and having an excellent planarization property, in which the reflow is promoted by the Si—H group, can be obtained. Further, as the dehydration reaction occurs to the intermediate reaction product by the heat treatment, a silicon-based on oxide film represented by (3) in the reaction formula shown in Formula 3, having a network structure and a low dielectric constant, can be obtained.

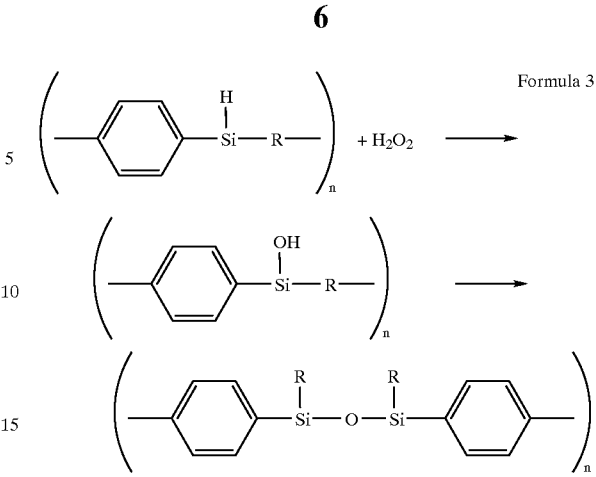

Formula 3

As described above, it has been confirmed that according to the present invention, an interlayer insulation film having an excellent property and a low relative dielectric constant of about 3.4, as compared to a relative dielectric constant of about 3.9 of an ordinary $SiO_2$ film obtained by heat oxidation, can be obtained.

Consequently, with the method of the present invention, for manufacturing a semiconductor device having a multi-layered wiring structure, with an improved version of step of forming an interlayer insulation film, an interlayer insulation film having an excellent property and a low relative dielectric constant can be manufactured without providing a step of planarization, at a low cost, and therefore the follow-up for a low dielectric insulation film which is required for a high-speed device, can be easily achieved.

Further, an interlayer insulation film having an excellent planarization property can be obtained, and therefore the deposition of an overlying wiring material, which is carried out after the formation of the interlayer insulation film, and the patterning of the overlying wiring layer, should not be adversely affected. Therefore, serious drawbacks such as a disconnection or a short circuit caused by breakage of overlying wiring, an increase in leak current in the interlayer insulation film, a decrease in voltage proof and the like can be prevented. Consequently, the density of the overlying wiring can be further increased, and the reliability of the device can be improved.

Figure 3:
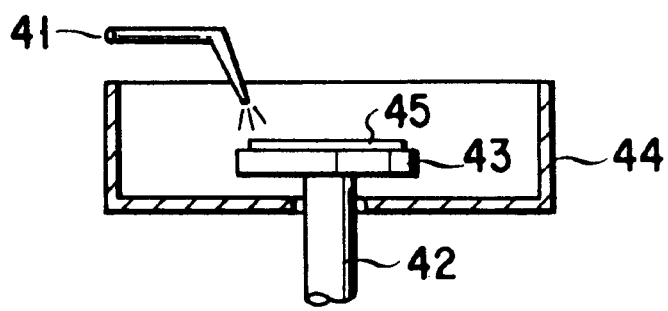
FIG. 3 is a schematic diagram showing the structure of a spin coat device, designed to illustrate the example of the method of manufacturing a semiconductor device, according to the present invention.

Another embodiment of the present invention will now be described with reference to FIG. 3.

In the case where the above-mentioned aromatic or heterocyclic compound having an Si—H group has a high viscosity, a step of applying such a compound on a semiconductor substrate at a low temperature by a spin coat technique, may be employed.

More specifically, a hole is made in the bottom surface of a cup 44, and a shaft 42 of a spin motor is provided therethrough to be rotatable, and a wafer chuck 43 is provided at a tip end of the shaft 42.

The aromatic compound is supplied from a nozzle 41 to a wafer 45 placed on the wafer chuck 43.

Next, a heat treatment is carried out at, for example, room temperature, so that the dehydration reaction occurs to the applied aromatic compound.

As described above, the first layer wiring portion is formed from the wafer 45 provided on the wafer chuck 43 and an interlayer insulation film having an excellent planarization property and a low relative dielectric constant can be obtained as in the first embodiment.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device having a multilayered wiring structure, comprising the steps of:

forming a first wiring portion on a semiconductor substrate;

introducing $H_2O_2$ and an aromatic or heterocyclic compound containing an Si—H group into a reaction chamber in which a semiconductor device is contained, and making them react with each other in a vacuum atmosphere of 665 Pa or lower at a temperature in a range of −10° C. to +10° C., thereby obtaining an intermediate reaction product on said semiconductor substrate and said first wiring portion, the intermediate reaction product having a planarization property in which a reflow thereof is promoted due to the Si—H group;

forming an interlayer insulation film by subjecting said intermediate reaction product to a heat treatment so as to induce a dehydration reaction, thereby obtaining a silicon-based oxide film serving as said interlayer insulation film having a reflow shape, a network structure and a low dielectric constant;

forming a plasma CVD $SiO_2$ film on said interlayer insulation film;

forming a contact hole in said interlayer insulation film and said plasma CVD $SiO_2$ film which communicates to said first wiring portion; and forming a second wiring portion which communicates to said first wiring portion via said interlayer insulation film, said plasma CVD $SiO_2$ film and said contact hole.

2. A method of manufacturing a semiconductor device having a multilayered wiring structure, comprising the steps of:

forming a first wiring portion on a semiconductor substrate;

applying an aromatic or heterocyclic compound containing an Si—H group on said first wiring portion and said semiconductor substrate by a spin-coat technique;

forming an interlayer insulation film having a network structure by carrying out a heat treatment so that a dehydration reaction takes place in said applied compound;

forming a plasma CVD $SiO_2$ film on said interlayer insulation film;

forming a contact hole in said interlayer insulation film and said plasma CVD $SiO_2$ film which communicates to said first wiring portion; and forming a second wiring portion which communicates to said first wiring portion via said interlayer insulation film, said plasma CVD $SiO_2$ film and said contact hole.

* * * * *